US010808138B2

(12) United States Patent
Balan

(10) Patent No.: US 10,808,138 B2
(45) Date of Patent: Oct. 20, 2020

(54) METAL-POLYMER COMPOSITE MATERIAL

(71) Applicants: Centre national de la recherche scientifique, Paris (FR); UNIVERSITE DE HAUTE ALSACE, Mulhouse (FR)

(72) Inventor: Lavinia Maria Balan, Hochstatt (FR)

(73) Assignees: CENTRE NATIONAL DE LA RECHERCHE SCIENTIFIQUE, Paris (FR); UNIVERSITE DE HAUTE ALSACE, Mulhouse (FR)

( * ) Notice: Subject to any disclaimer, the term of this patent is extended or adjusted under 35 U.S.C. 154(b) by 0 days.

(21) Appl. No.: 15/561,669

(22) PCT Filed: Mar. 25, 2016

(86) PCT No.: PCT/EP2016/056726
§ 371 (c)(1),
(2) Date: Sep. 26, 2017

(87) PCT Pub. No.: WO2016/151141
PCT Pub. Date: Sep. 29, 2016

(65) Prior Publication Data
US 2018/0072907 A1 Mar. 15, 2018

(30) Foreign Application Priority Data
Mar. 26, 2015 (EP) ..................... 15305444

(51) Int. Cl.
*C09D 11/52* (2014.01)
*G03F 7/004* (2006.01)
(Continued)

(52) U.S. Cl.
CPC .............. *C09D 11/52* (2013.01); *B05D 3/067* (2013.01); *B05D 5/063* (2013.01); *B05D 7/542* (2013.01);
(Continued)

(58) Field of Classification Search
CPC ......... B05D 3/067; B05D 6/063; B05D 7/542
See application file for complete search history.

(56) References Cited

U.S. PATENT DOCUMENTS 3,615,457 A * 10/1971 Seibert ................... G03F 7/0047
430/198
6,807,906 B1 * 10/2004 DeMoore ............ B41F 23/0443
101/424.1
(Continued)

FOREIGN PATENT DOCUMENTS

CN 102778776 A 11/2012
CN 103333333 A 10/2013
(Continued)

OTHER PUBLICATIONS

Lavinia Balan, Colette Turck, Olivier Soppera, Loic Vidal, Daniel J. Lougnot. Holographic Recording with Polymer Nanocomposites Containing Silver Nanoparticles Photogenerated in Situ by the Interference Pattern. Chemistry of Material. 21. 5711-5718. (Year: 2009).*
(Continued)

*Primary Examiner* — Dah-Wei D. Yuan
*Assistant Examiner* — Kristen A Dagenais-Englehart
(74) *Attorney, Agent, or Firm* — Troutman Pepper Hamilton Sanders LLP

(57) ABSTRACT

The present invention relates to composite material comprising a matrix and a metallic layer located at at least one surface of said composite material, said matrix comprising at least one polymer and a first population of particles of at least one electronically conducting metal, said layer comprising a second population of particles of at least one electronically conducting metal, a method for preparing such composite material and applications thereof.

13 Claims, 2 Drawing Sheets

Figure 1:
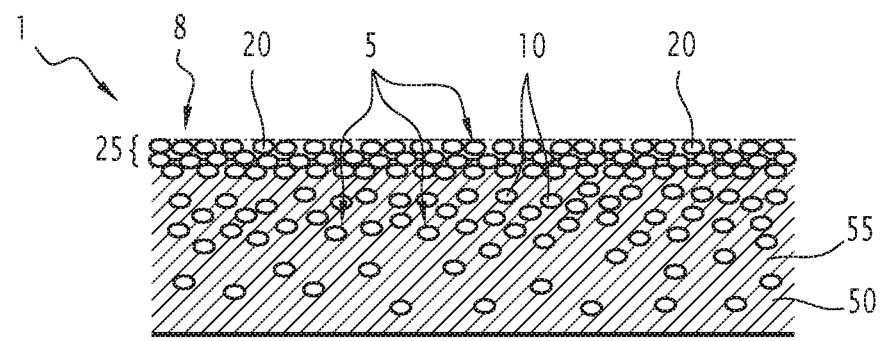

(51) Int. Cl.
| | |
|---|---|
| C09D 7/61 | (2018.01) |
| B05D 3/06 | (2006.01) |
| B05D 5/06 | (2006.01) |
| B05D 7/00 | (2006.01) |
| B32B 27/12 | (2006.01) |
| B32B 27/16 | (2006.01) |
| B32B 27/18 | (2006.01) |
| B32B 27/30 | (2006.01) |
| C08K 3/08 | (2006.01) |
| C09D 4/00 | (2006.01) |
| C09D 5/33 | (2006.01) |
| C09D 5/24 | (2006.01) |
| C09D 11/101 | (2014.01) |
| C09D 11/107 | (2014.01) |
| C09D 11/322 | (2014.01) |
| G03F 7/20 | (2006.01) |
| H01B 1/22 | (2006.01) |

(52) U.S. Cl.
CPC .............. *B32B 27/12* (2013.01); *B32B 27/16* (2013.01); *B32B 27/18* (2013.01); *B32B 27/308* (2013.01); *C08K 3/08* (2013.01); *C09D 4/00* (2013.01); *C09D 5/004* (2013.01); *C09D 5/24* (2013.01); *C09D 7/61* (2018.01); *C09D 11/101* (2013.01); *C09D 11/107* (2013.01); *C09D 11/322* (2013.01); *G03F 7/0047* (2013.01); *G03F 7/2004* (2013.01); *H01B 1/22* (2013.01); *B32B 2250/02* (2013.01); *B32B 2255/10* (2013.01); *B32B 2255/205* (2013.01); *B32B 2264/105* (2013.01); *B32B 2307/202* (2013.01); *B32B 2307/302* (2013.01); *B32B 2307/416* (2013.01); *B32B 2457/00* (2013.01); *C08K 2003/085* (2013.01); *C08K 2003/0806* (2013.01); *C08K 2003/0831* (2013.01); *C08K 2003/0893* (2013.01); *C08K 2201/001* (2013.01)

(56) References Cited

U.S. PATENT DOCUMENTS

| | | | |
|---|---|---|---|
| 2004/0079195 A1 | 4/2004 | Perry et al. | |
| 2007/0278422 A1* | 12/2007 | Einhorn .................. | B42D 25/29 250/462.1 |
| 2008/0085410 A1 | 4/2008 | Simone et al. | |
| 2009/0022995 A1* | 1/2009 | Graham .................. | C09D 5/38 428/409 |
| 2009/0206520 A1* | 8/2009 | Park ....................... | B82Y 10/00 264/401 |
| 2014/0027038 A1 | 1/2014 | Lee | |
| 2015/0038033 A1 | 2/2015 | Gaynor | |

FOREIGN PATENT DOCUMENTS

| | | |
|---|---|---|
| JP | 3-212833 A | 8/1993 |
| JP | 2012-12529 A | 1/2012 |
| JP | 2012-129133 A | 7/2012 |
| JP | 2014-98178 A | 5/2014 |
| JP | 2014-117902 A | 6/2014 |
| NL | 7004711 A | 10/1970 |
| WO | 2008155350 A1 | 12/2008 |
| WO | 2011079329 A2 | 7/2011 |

OTHER PUBLICATIONS

European Search Report dated Sep. 11, 2015 during the prosecution of European Application No. EP15305444.

International Search Report and Written Opinion of the International Searching Authority dated Jul. 6, 2016 during the prosecution of International Application No. PCT/EP2016/056726.

Jradi, S., "Spatially Controlled Synthesis of Silver Nanoparticles and Nanowires by Photosensitized Reduction," Nanotechnology, vol. 21, 2010, p. 095605, XP20175280.

L Balan, M Jin, JP Malval, H Chaumeil, A Defoin, L Vidal « Fabrication of silver nanoparticle-embedded polymer promoted by combined photochemical properties of 2,7-diaminofluorene derivative dye » Macromolecules 41 2008) 9359-9365.

L. Balan, C. Turck, O. Soppera, D. Lougnot, "Holographic recording with polymer nanocomposites containing silver nanoparticles photogenerated in situ by the interference pattern" Chemistry of Materials 2124), 2009) 5711-5718.

L Balan, J-P Malval, R Schneider, D. Le Nouen, D-J Lougnot « in situ fabrication of polyacrylate-silver nanocomposite through photoinduced tandem reactions involving eosin dye» Polymer 51 2010) 1363-1369. S. Jradi.

L. Balan, X.H. Zeng, J. Plain, D.J. Lougnot, P. Royer, R. Bachelot, O. Soppera "Spatially controlled synthesis of silver nanoparticles and nanowires by photosensitized reduction" Nanotechnology 21 2010) 095605.

T. Buruiana, V. Melinte, A. Chibac, L. Balan "Synthesis and evaluation of urethane oligodimethacrylates used in preparing biocide hybrid composites containing Ag nanoparticles" J. Biomater. Sci. Polym. Ed. 23 2012) 955-972.

L Balan, V Melinte, T Buruiana, R Schneider, L Vidal "Controlling the morphology of gold nanoparticles synthesized photochemically in a polymer matrix through photonic parameters" Nanotechnology 23, 2012, 415705 Editor's choice October; http://nanotechweb.org/cws/article/lab/51091.

L. Balan, C. M. Ghimbeu, L. Vidal, C. Vix-Guter "Photoassisted synthesis of manganese oxide nanostructures by visible light at room temperature" Green Chem., 15 2013) 2191-2199.

Takahiro Ohkubo et al. "Nanospace-enhanced photoreduction for the synthesis of copper(I) oxide nanoparticles under visible-light irradiation", Journal of Colloid and Interface Science 421 (2014) 165-169.

Xiaoqun Zhu at al. "Direct, Rapid, Facile Photochemical Method for Preparing Copper Nanoparticles and Copper Patterns", Langmuir 2012, 28, 14461-14469 (dx.doi.org/10.1021/la303244p).

S. S. Joshi, et al. "Radiation Induced Synthesis and Characterization of Copper Nanoparticles", NanoStructured Materials, vol. 10, No. 7, pp. 1135-1144, 1998.

Subrata Kundu et al., "Formation of electrically conductive palladium nanowires on polymer scaffolds by photochemica approach", Colloids and Surfaces A: Physicochem. Eng. Aspects 360 (2010) 129-136.

S. Navaladian et al. "A Rapid Synthesis of Oriented Palladium Nanoparticles by UV Irradiation", Nanoscale Res Lett (2009) 4:181-186 (DOI 10.1007/s11671-008-9223-4).

Miyama, Toshihito and Yonezawa, Yoshiro, "Photoinduced formation and aggregation of silver nanoparticles at the surface of carboxymethylcellulose films," Journal of Nanoparticle Research 2004, vol. 6: pp. 457-465.

* cited by examiner

METAL-POLYMER COMPOSITE MATERIAL

CROSS-REFERENCE TO RELATED APPLICATIONS

This is a U.S. national phase application under 35 U.S.C. § 371 of International Patent Application No. PCT/EP2016/056726, filed Mar. 25, 2016, and claims benefit of priority to European Patent Application No. 15305444.0, filed Mar. 26, 2015. The entire contents of these applications are hereby incorporated by reference.

FIELD OF TECHNOLOGY

The present invention relates to a metal-polymer composite material. The invention also relates to the preparation of such material by a method comprising the photo polymerization of the polymer and the photo-reduction of the metal. The present invention also relates to application of this composite material.

BACKGROUND

It is known in the art to produce ink containing metallic particles notably for applications in electronic devices. These inks suffer the disadvantage of presenting a high concentration of metallic particles, in general around 60% by weight.

It is also known to prepare metal-polymer composite materials. However such composite polymers are to be improved notably for the production of electricity or for manufacturing electronic conducting devices.

In particular, it is known to prepare nanoparticles in polymer matrix (L Balan, M Jin, J P Malval, H Chaumeil, A Defoin, L Vidal «Fabrication of silver nanoparticle-embedded polymer promoted by combined photochemical properties of 2,7-diaminofluorene derivative dye» Macromolecules 41 2008) 9359-9365. L. Balan, C. Turck, O. Soppera, D. Lougnot, "Holographic recording with polymer nanocomposites containing silver nanoparticles photogenerated in situ by the interference pattern" *Chemistry of Materials* 2124), 2009) 5711-5718. L Balan, J-P Malval, R Schneider, D. Le Nouen, D-J Lougnot «In situ fabrication of polyacrylate-silver nanocomposite through photoinduced tandem reactions involving eosin dye« *Polymer* 51 2010) 1363-1369. S. Jradi, L. Balan, X. H. Zeng, J. Plain, D. J. Lougnot, P. Royer, R. Bachelot, O. Soppera "Spatially controlled synthesis of silver nanoparticles and nanowires by photosensitized reduction" *Nanotechnology* 21 2010) 095605. T. Buruiana, V. Melinte, A. Chibac, L. Balan "Synthesis and evaluation of urethane oligodimethacrylates used in preparing biocide hybrid composites containing Ag nanoparticles" *J. Biomater. Sci. Polym. Ed.* 23 2012) 955-972 L Balan, V Melinte, T Buruiana, R Schneider, L Vidal "Controlling the morphology of gold nanoparticles synthesized photochemically in a polymer matrix through photonic parameters" *Nanotechnology* 23, 2012) 415705 Editor's choice October http://nanotechweb.org/cws/article/lab/51091 L. Balan, C. M. Ghimbeu, L. Vidal, C. Vix-Guter "Photoassisted synthesis of manganese oxide nanostructures by visible light at room temperature" *Green Chem.,* 15 2013) 2191-2199.

However such material containing metallic particles, and particularly nanoparticles may present varying colors that do not exhibit a reflective metallic surface or do not generate a layer enabling conducting electricity.

Regarding the preparation of metallic surface on glass substrates, a solution of silver nitrate, sodium hydroxide, ammonium hydroxide and sugar (or formaldehyde) is usually used to generate a layer of silver on glass. The glass is previously treated with $SnCl_2$. This method is used in particular to produce thermos flasks, CDs or other decorations.

SUMMARY

The invention aims at providing a metal-polymer composite material presenting an electronically conducting layer of metallic particles.

The invention also aims at providing a composite material presenting optical properties, in particular presenting a metallic mirror surface.

The invention aims at providing a process for preparing such materials. In particular the invention aims at providing such a process while saving costs and for production on an industrial scale. In particular, the invention aims at providing a process for manufacturing such materials that would be environmental friendly.

The invention also aims at providing a composition for coating a substrate for providing optical properties such as for example a mirror surface, a colored surface, or an electronically conducting surface, or a thermally conducting surface.

BRIEF DESCRIPTIONS OF THE DRAWINGS

FIG. 1 represents a schematic representation of a transverse section of a composite material 1 of the invention, wherein nanoparticles 20 are at least partially embedded in the matrix 50.

Figure 2:
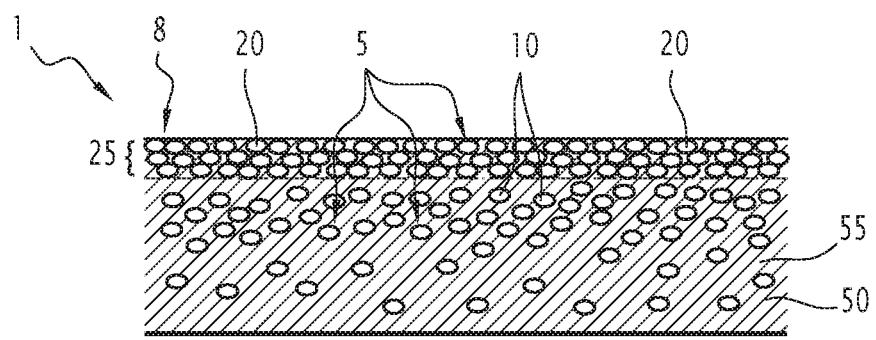

FIG. 2 represents a schematic representation of a transverse section of a composite material 1 of the invention, wherein nanoparticles 20 are totally embedded in the matrix 50.

Figure 3:
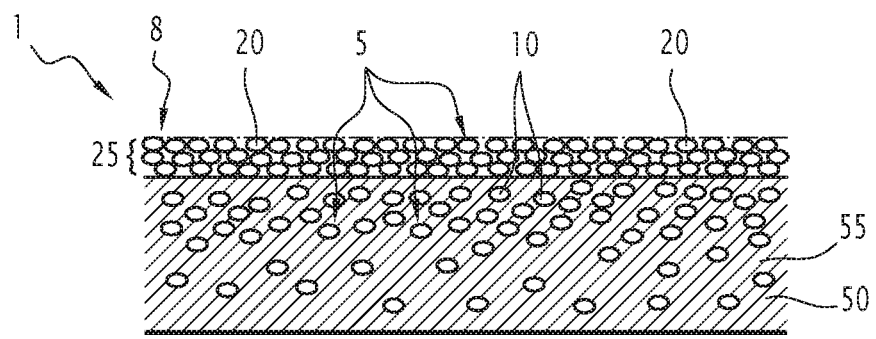

FIG. 3 represents a schematic representation of a transverse section of a composite material 1 of the invention, wherein said nanoparticles 20 are on the matrix 50.

Figure 4:
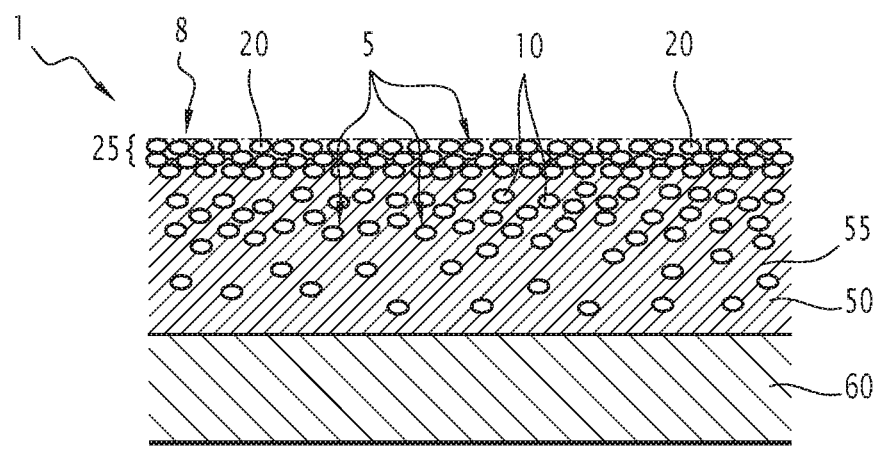

FIG. 4 represents a schematic representation of a transverse section of a composite material 1 of the invention comprising a substrate 60.

Figure 5:
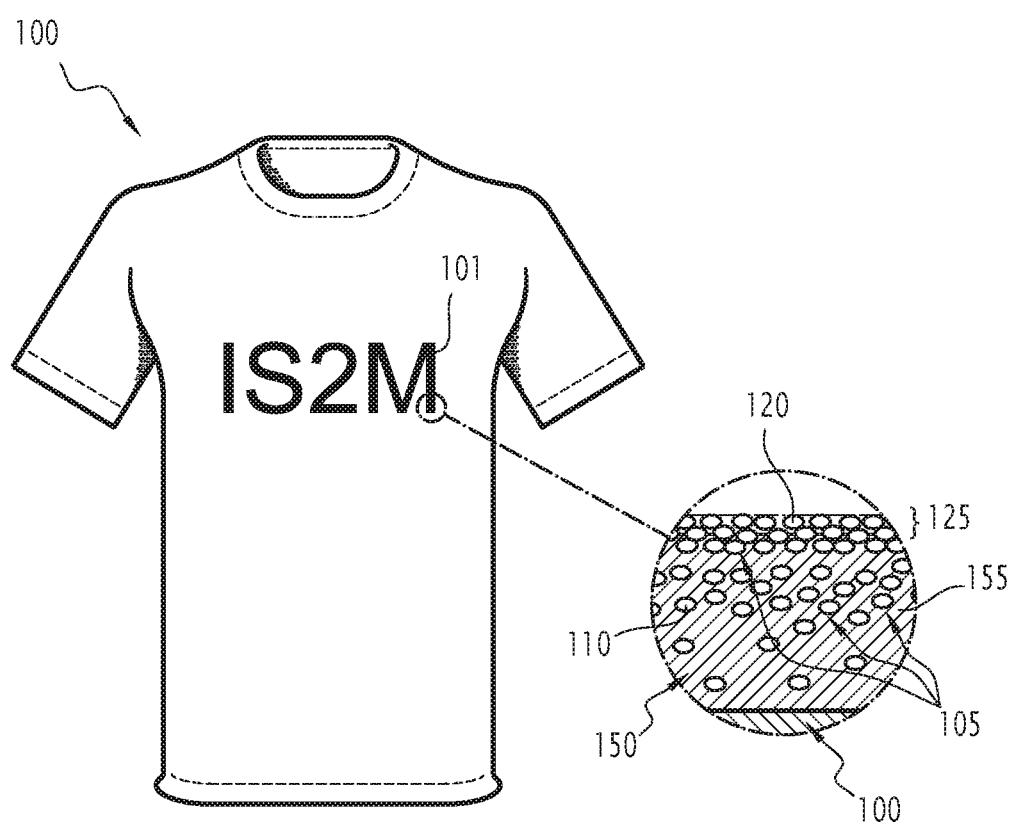

FIG. 5 represents a schematic representation of a textile substrate (here a T-shirt, for example) comprising a composite material 101 including nanoparticles 105, 110, 120 according to the invention, dispersed in the matrix 150, said composite material 101 being for example obtained by applying on the textile substrate 100 a liquid composition according to the invention and photopolymerization of the matrix 150 and photoreduction of the electronically conducting metal precursor to form particles 105, 110, 120 of electronically conducting metal.

DETAILED DESCRIPTION

The present description is illustrated by reference to the figures without any limitation.

The present inventor has discovered that a material according to a composite material 1, 101 comprising a matrix 50, 150 and a metallic layer 25, 125 located at at least one surface 8 of said composite material 1, 101, said matrix 50, 150 comprising at least one polymer 55, 155 and a first population 10, 110 of particles of at least one electronically conducting metal, said layer 25, 125 comprising a second population of particles 20, 120 of at least one electronically conducting metal enables solving the here-above mentioned technical problems.

According to one aspect, in said composite material 1, 101, the concentration of the particles of said second population 20, 120 in said layer is greater than the concentration of the particles of the first population 10, 110 in said matrix 50, 150.

According to one aspect, said layer 25, 125 located at at least one surface 8 of said composite material 1, 101 is an electronically conducting layer.

According to one aspect, said layer 25, 125 located at at least one surface 8 of said composite material 1, 101 forms a metallic mirror surface.

The inventor has discovered a process for preparing such materials that overcome the here-above mentioned technical problems.

The invention notably relates to a novel photo-assisted approach to prepare a metallic surface or metallic mirror. This photo-induced approach was discovered for in situ synthesis of metal nanoparticles in a photopolymerizable matrix. This method is based on coupling the photopolymerizing kinetics of the matrix with the photo-reducing kinetics of the metallic particles.

In particular, the invention relates to a composite material, wherein said layer 25, 125 of nanoparticles 20, 120 is at least partially embedded in the matrix 50, 150, or wherein said layer 25, 125 of nanoparticles 20, 120 is totally embedded in the matrix 50, 150), or wherein said layer 25, 125 of nanoparticles 20, 102 is on the matrix 50, 150. The layer 25, 125 is also called here a surface layer.

The layer 25 forms advantageously a metallic layer. The layer 25 forms advantageously a metallic mirror layer.

The average diameter of the particles is measured according to the following procedure:

Transmission electron microscopy (TEM) is used for measuring the average diameter of the particles 5, 105. Measures are obtained using a Philips CM200 instrument with LaB6 cathode operated at 200 kV. A drop of liquid formulations was placed onto a copper grid. As for the nanocomposites obtained after UV-cured, they were cut by means of a microtome (LKB model 8800) and placed onto the observation grid. This measurement also enables characterizing the size and morphology of the particles. Reference is made for example to: Transmission Electron Microscopy; A Text Book for Materials Science D. B. Willians et C. B. Carter Ed. Springer Science ISBN 978-0-387-76500-6 LLC 1996-2009.

In particular, the invention relates to a composite material, wherein said first population 10, 110 of particles has a mean diameter of from 1 to 100 nanometers, for example from 5 to 50 nanometers.

In one embodiment, the invention relates to a composite material, wherein said second population 20, 120 of particles has a mean diameter of from 1 to 100 nanometers, for example from 5 to 50 nanometers or for example from 10 to 100 nanometers.

In one embodiment, the invention relates to a composite material, wherein said second population 20, 120 of particles has a mean diameter of from 100 nanometers to 1 micrometer, for example from 200 to 800 nanometers, when observed with scanning electron microscopy (SEM). Such particles could result from the aggregation of smaller particles.

Preferably, the particles of the first and second populations are essentially the same particles. Advantageously, the particles of the first and second populations are essentially the same particles as they are formed in situ starting from the same precursors. According to one embodiment, the particles of the second population may form aggregates in the surface layer.

In one embodiment, the particles present a round shape.

In one embodiment, said layer of said second population of particles 20 has a thickness of from 1 to 100 micrometers, or for example from 5 to 500 nanometers or from 5 to 50 nanometers.

In one embodiment, said layer of said second population of particles 20 has a thickness of from 1 to 100 nanometers.

In one embodiment, said layer of said second population of particles 20 has a thickness of at least 100 nanometers, for example from 100 to 500 nanometers.

In one embodiment, said layer of said second population of particles 20 has a thickness of from 100 nanometers to 3000 micrometers, for example from 200 to 500 micrometers or from 550 to 2000 micrometers.

In one embodiment, said matrix 50 forms a layer having a thickness of from 10 nanometers to 3 millimeters. This thickness may or not include the thickness of the layer of the second population of particles, depending on the specific embodiment.

In one embodiment, said layer 25 of said second population of particles 20 presents a resistivity of less than $1 \cdot 10^{-2}$ Ohm·m.

In one embodiment, the concentration of the particles in the composite material 1, 101 decreases from the surface layer 25, 125 to the matrix 50, 150.

In one embodiment, the concentration of the particles in the matrix 50, 150 decreases with the increase of depth in the matrix 50, 150 (when analyzing the composite material from the surface layer 25, 125 to the matrix 50, 150).

In one embodiment, the particles of the first population 10, 110 in the matrix 50, 150 present an essentially homogenous dispersion in the matrix.

In one embodiment, the particles of the first population 10, 110 in the matrix 50, 150 present different concentrations in the matrix.

In one embodiment, the concentration of the particles of the first population in the matrix presents a gradient of concentration decreasing from the outer surface inwardly.

In one embodiment, a part of the particles of the first population 10, 110 forms a sub-layer of particles dispersed in the matrix, said sub-layer being in contact with the surface layer 25,125, and another part of the particles of the first population 10, 110 is dispersed in the matrix in contact with the sub-layer. In one embodiment, the concentration of particles is essentially homogenous respectively within the matrix and the sub-layer.

The invention relates according to a particular embodiment to a composite material wherein said electronically conducting metal is selected from Ag, Au, Cu, Pd, Pt, Cr, Zn, Al, or any mixture thereof.

In one specific embodiment, the particles 5 are nanoparticles of silver.

In one specific embodiment, the particles 5 are nanoparticles of gold.

In one specific embodiment, the particles 5 are nanoparticles of copper. An example of such nanoparticles is described by Takahiro Ohkubo et al. *"Nanospace-enhanced photoreduction for the synthesis of copper(I) oxide nanoparticles under visible-light irradiation"*, Journal of Colloid and Interface Science 421 (2014) 165-169, or by Xiaoqun Zhu at al. *"Direct, Rapid, Facile Photochemical Method for Preparing Copper Nanoparticles and Copper Patterns"*, Langmuir 2012, 28, 14461-14469 (dx.doi.org/10.1021/la303244p), or by S. S. Joshi, et al. *"Radiation Induced*

*Synthesis and Characterization of Copper Nanoparticles*", NanoStructured Materials, Vol. 10, No. 7, pp. 1135-1144, 1998.

In one specific embodiment, the particles 5 are nanoparticles of palladium. An example of such nanoparticles is described by Subrata Kundu et al., *"Formation of electrically conductive palladium nanowires on polymer scaffolds by photochemical approach"*, Colloids and Surfaces A: Physicochem. Eng. Aspects 360 (2010) 129-136, or by S. Navaladian et al. *"A Rapid Synthesis of Oriented Palladium Nanoparticles by UV Irradiation"*, Nanoscale Res Lett (2009) 4:181-186 (DOI 10.1007/s11671-008-9223-4).

In one specific embodiment, the particles 5 are nanoparticles of chromium.

In one specific embodiment, the particles 5 are nanoparticles of tin.

In one embodiment, said electronically conducting metal at oxidation state zero (0). It is included within the scope of the present invention that at least a part of metal present is at a different oxidation state, especially if the surface is in contact with an oxidizing element, for example such as air or oxygen.

In one specific embodiment, the layer 25 of nanoparticles 20 is protected from oxidation by the matrix 50. In such an embodiment, the nanoparticles 20 are embedded in the matrix (see for example FIG. 2).

In another embodiment, a further photo-polymerizable varnish is used to protect the surface of the layer 25, 125 of the second population of particles 20, 120 from air or atmosphere. Said photo-polymerizable varnish may be deposited on the surface of layer 25 after the photo-polymerization step forming the matrix 55 with the populations of particles 10, 20.

Advantageously, the composite material of the invention presents a metallic mirror layer at only one surface, the opposite surface being free of metallic mirror layer.

In another embodiment, the composite material of the invention presents a metallic mirror layer at two different surfaces or interfaces of the composite material. More specifically the composite material comprises a first metallic layer 25, 125 of the second population of particles 20, 120, and a second metallic layer 25, 125 of the second population of particles 20, 120 on an opposite surface of the composite material. The term surface designates a geometrical surface of the composite material, not only a surface in contact with atmosphere. The surface of the composite material may be in contact with a substrate.

In one embodiment, said layer 25, 125 forms an electronic conducting/or thermo-conducting layer. In one specific embodiment, said layer 25, 125 forms an electronic conducting layer comprising or consisting essentially of particles of the second population of particles 20, 120 which are spatially close enough to conduct electrons and more specifically to conduct an electric current. In one embodiment, particles of the second population of particles 20, 120 are so spatially close that they aggregate or coalesce to form larger particles.

In one embodiment, said layer 25, 125 forms a colored layer.

Advantageously, said color is dependent on the shape, size, concentration and composition of the second population of metallic particles 20, 120.

In one embodiment, the second population of metallic particles 20, 120 presents a spherical shape.

In one embodiment, the second population of metallic particles 20, 120 presents a rectangular shape.

Also the invention relates according to one embodiment to a composite material comprising particles having a gradient of particle size, wherein larger particles 20, 120 are located at one surface 8 (the surface exposed to irradiation according to the method of the invention and preferably forming the metallic layer 25, 125) and smaller particles 10, 110 are located at the opposite surface (the surface less exposed to irradiation according to the method of the invention).

In one specific embodiment, said polymer 55, 155 is a photo-induced polymer formed by the polymerization of at least one photopolymerizable monomer, for example ethyleneglycol monomers, preferably said polymer 55, 155 is a polyethylene glycol (PEG) or comprises a PEG block polymer, or mixture of other monomers with PEG.

Preferably, said polymer comprises units formed by radicals of photo-initiators.

In one specific embodiment, said composite material 1 further comprises a substrate 60, 100.

For example, said substrate is selected from the group consisting of silica; textile; metallic substrates, such as for example inox, aluminum, alloy; wood; terephthalate, such as for example polyfluoroalkylene (tetrafluoroethylene—Teflon®), plastic materials, and any mixture thereof.

The invention also relates to a method for preparing a composite material, said method comprising:
 a) preparing a liquid composition comprising at least one precursor of at least one electronically conducting metal, at least one photopolymerizable monomer, and optionally at least one photo-initiator;
 b) exposing the liquid composition obtained in step a) to UV radiations to photopolymerize said monomer to form a polymer matrix 50, 150; and form particles 5, 105 of said conducting metal, wherein said particles 5, 105 form at least two populations of particles wherein a first population 10, 110 of particles is dispersed in the polymer matrix 50, 150, and wherein a second population of particles 20, 120 forms a layer 25, 125 located at at least one surface 8 of said composite material 1, 101.

In one embodiment, the method according to the present invention comprises c) exposing the composite material obtained in step b) to UV radiations to form another layer 25, 125 located at another surface of said composite material 1, 101.

For example, step b) of the method according to the invention form a first metallic layer, preferably a metallic mirror layer, at one surface of the composite material, for example in contact with atmosphere. Another surface of the composite material is then exposed to UV radiations to form a second metallic layer, preferably a metallic mirror layer. The surfaces are exposed sequentially or simultaneously to UV radiations to form the different layers at different surfaces of the composite material.

In one embodiment, the liquid composition is placed on a transparent substrate (glass for example). The surface of the liquid composition in contact with atmosphere is exposed to UV radiations to photopolymerize the monomer to form a polymer matrix having particles dispersed therein and particles forming a metallic surface layer. The composite material is exposed on the transparent substrate side to UV radiations to form a metallic surface layer on the transparent substrate side. The composite material thereby obtained comprises two metallic layer, one on a surface in contact with air and another one in contact with the transparent substrate.

Advantageously in one embodiment, the concentration of said particles of said second population (20, 120) in said layer is greater than the concentration of the first population (10, 110) in said matrix (50, 150).

Advantageously, said layer 25, 125 located at at least one surface 8 of said composite material 1, 101 is an electronically conducting layer.

Advantageously, said layer 25, 125 located at at least one surface 8 of said composite material 1, 101 forms a metallic mirror surface.

In one embodiment, the metallic particles comprise or are consisting of metallic particles or metallic oxide particles.

By "precursor of at least one electronically conducting metal" or "metallic precursor" it is meant a chemical species comprising at least one metal, said chemical species being suitable for forming metallic particles or metallic oxide particles during the irradiation step according to the method of the present invention.

In one embodiment, the precursor of at least one electronically conducting metal comprises preferably at least one metal selected from the group consisting of gold, silver, palladium, tin, copper, nickel, platinum, aluminum or any combination or mixture thereof.

In one embodiment, the precursor of at least one electronically conducting metal is a metallic salt and preferably enables forming metallic nanoparticles.

Metallic nanoparticles provide notably a large range of optical properties depending on their size, and/or their shape. These optical properties may be moderated through the matrix component, for example depending on the refraction index of the matrix in which the metallic nanoparticles are dispersed.

As metallic salts, halogen salts may be used such as chloride or bromide, or nitride or acetate of metallic elements. For example such metallic salts may be selected from the group consisting of a metal of tetrachloroaurate, a metal of tetrabromoaurate, a metal of nitrate, palladium acetate, palladium chloride, platinum chloride, copper chloride, manganese nitrate, tetrahydrate, manganese chloride, and any mixture thereof.

The amount of metallic salt in the liquid composition may vary depending on the monomer and the desired properties of the final material. For example, the amount of metallic salt, calculated on the basis of all components present in the liquid composition, may vary from 0.1 to 20%, from 2 to 20%, and preferably is higher than 2 by weight with respect to the total weight of the liquid composition. In one specific embodiment, the metallic salt is present at a concentration of 4 to 10%, for example from 5 to 8%, by weight with respect to the total weight of the liquid composition.

Preferably, said concentration of electronically conducting metal is of at least 1%, preferably of at least 1.5%, even more preferably of at least 2%, by weight relative to the total weight of the liquid composition.

In one embodiment, the concentration of electronically conducting metal is less than 40%, preferably of less than 30%, even more preferably of at least 20%, by weight relative to the total weight of the liquid composition.

In one embodiment the concentration of electronically conducting metal precursor is of 2 to 10% by weight relative to the total weight of the liquid composition.

For example, said electronically conducting metal precursor is selected from the group consisting of a salt of an electronically conducting metal silver nitrate, gold bromate, tetrachloroaurate, tetrabromoaurate, palladium chloride palladium acetate, platinum chloride, copper acetate, copper chloride, and any mixture thereof.

In one embodiment the monomer is preferably selected from the group consisting of monomers with ethylenic double bond, such as acrylates or methacrylates of alkyls or derivatives thereof, acrylates or methacrylates of hydroxyalkyls, aromatic vinylic monomers or their derivatives, N-vinyl-lactames and their derivatives, or any mixtures thereof.

In one embodiment the monomer is a macromonomer. Such macromonomer may be for example selected from the group consisting of polyalkylglycol acrylates, poly(polyhydroxyalkyl) acrylates, such as for example polyalkylglycol diacrylate or dimethacrylate, alkyldiol diacrylate or dimethacrylate, in particular PEG multi-acrylate (polyethylene glycol multi-acrylate) including PEG diacrylate and PEG multi-methacrylate, and for example PEG(600) diacrylate, PEG(400) diacrylate, PEG(600) dimethacrylate, PEG(400) dimethacrylate, ethylene glycol dimethacrylate, hexanediol diacrylate, pentaerythritol triacrylate, ethoxylated pentaerythritol tetraacrylate, for example PETTA, trimethylol propane triacrylate (such as TMPTA), ethoxylated bisphenol diacrylate, such as for example ethoxylated (10) disphenol diacrylate, or any mixture thereof. The term "acrylate" includes "methacrylate" units unless indicated otherwise.

In one specific embodiment, the monomer presents a diacrylate moiety, i.e. has only two polymerizable acrylate groups.

In one specific embodiment, the monomer does not comprise an aromatic group.

In one embodiment, the liquid composition does not comprise any solvent of the monomer.

Preferably, the monomer is present at a concentration of 50 to 99.9% by weight with respect to the total weight of the liquid composition. In one embodiment, the monomer is present at a concentration of 70 to 99.9%, for example 80 to 98%, for example 90 to 98%, or for example 87 to 96%, by weight with respect to the total weight of the liquid composition.

The monomer may be present as a mixture of monomers. In one preferred embodiment, the mixture of monomers comprises at least one macromonomer selected from the group consisting of: polyalkylglycol acrylates, poly(polyhydroxyalkyl) acrylates, such as for example polyalkylglycol diacrylate or dimethacrylate, alkyldiol diacrylate or dimethacrylate, in particular PEG multi-acrylate (polyethylene glycol multi-acrylate) including PEG diacrylate and PEG multi-methacrylate, and for example from 10 to 20% by weight of such macromonomer, relative to the total weight of monomers present.

Advantageously, the monomer is a solvent of the precursor of at least one electronically conducting metal.

Advantageously, the monomer is a solvent of the photo-initiator if present.

In one embodiment, the liquid composition presents a viscosity of about the viscosity of the one or more monomers present.

In one embodiment, the liquid composition is a solution comprising or consisting of at least one precursor of at least one electronically conducting metal, at least one photopolymerizable monomer, and optionally at least one photo-initiator.

In another embodiment, the liquid composition is a suspension comprising or consisting of at least one precursor of at least one electronically conducting metal, at least one photopolymerizable monomer, and optionally at least one photo-initiator.

Preferably, the photo-initiator contains a chromophore group, i.e. a chemical structure able to absorb specific light radiations, and in particular UV or visible radiations, and upon appropriate irradiation, it generates highly reactive species such as radicals or ions.

The chromophore may be present as a mixture of chromophores. The chromophore is also known as photo-initiator when generating radical species. A photo-initiator is preferably a compound which, in the presence of a UV light radiation, undergoes a photo-induction reaction and produces reactive species such as radicals which induct photopolymerization of unsaturated ethylenic functions. The radical photo-initiator is preferably selected from the group consisting of for example the hydroxyalkylphenones, α-aminocetones, acylphosphine oxides, benzaldehyde, benzophenones, benzylic dicetals, thioxanthones and mixtures thereof. Preferably, the photo-initiator is selected from the group consisting of acylphosphine oxide, notably bis(2,4,6-trimethylbenzoyl)-phenylphosphinoxide marketed under Irgacure 819, 1-[4-(2-hydroxyethoxy)-phenyl]-2-hydroxy-2-methyl-1-propane-1-one marketed under Irgacure 2959, 2-2-dimethoxy-1,2-di(phenyl)ethanone marketed under Irgacure 651, 2-(dimethylamino)-1-(4-morpholin-4-ylphenyl)-2-(phenylmethyl)butan-1-one marketed under Irgacure 369, bis(2,6-difluoro-3-(1(hydropyrro-1-yl)-phenyl)titanocene marketed under Irgacure 784, 1-hydroxycyclohexyl)-phenyl-methanone marketed under Irgacure 184, and ethyl-2,4,6-Trimethylbenzoylphenylphosphinate marketed under Lucirin TPO-L, now Irgacure TPO-L. Also Irgacure 500 which is a 1:1 mixture of 50% of 1-hydroxy-cyclohexyl-phenyl-cetone and 50 wt % of benzophenone may be used.

When present in the mixture the amount of chromophore varies typically from 0.01% to 10%, by weight relative to the total weight of the mixture.

Preferably, the concentration of the photo-initiator is sufficient to initiate the polymerization of the monomer, and for example of from 0.05 to 10%, for example from 0.1 to 4%, preferably from 0.2 to 3%, by weight relative to the total weight of the liquid composition.

In one embodiment, the concentration of the photo-initiator is of 0.2 to 1% by weight relative to the total weight of the liquid composition.

In one embodiment the liquid composition comprises a stabilizer avoiding the oxidation of the metallic particles to be formed according to the method of the present invention.

The invention also relates to a liquid composition as defined in the present invention.

The invention also relates to a method for preparing the composite material according to the invention wherein said liquid composition is deposited on a substrate.

The composite material 1, 101 of the invention, and in particular the metallic layer 25, 125, provides a good adhesion or cohesion with the substrate 60, 100. Advantageously, when the substrate 60, 100 is porous, such as for example a textile substrate, the liquid composition may penetrate the surface of the porous substrate which provides a composite material 1, 101 very cohesive with the substrate 60, 100. This has the technical advantage of providing a metallic layer 25, 125 of nanoparticles adhering to the substrate. This limits or avoids the delamination of the metallic layer 25, 125 of nanoparticles from the substrate 60, 100.

In one embodiment, said liquid composition is deposited by a spin coating, dip coating, ink printing, serigraphy, spraying process or any combination thereof.

The invention also relates to a method wherein said photopolymerization is performed in the presence of a UV source providing an intensity sufficient to induce the photopolymerization and the photoreduction of the electronically conducting metal precursor to form particles of electronically conducting metal, and wherein the particles form at least two populations of particles as defined according to the present invention.

In one embodiment, said photopolymerization is performed in the presence of a UV source providing an intensity of at least 0.5 W/cm$^2$, preferably of at least 1 W/cm$^2$ on the liquid composition.

In one embodiment, said photopolymerization is performed during a time sufficient to induce the photopolymerization and the photoreduction of the electronically conducting metal precursor to form particles of electronically conducting metal, wherein the particles form at least two populations of particles as defined according to the present invention.

In one embodiment, said photopolymerization is performed during at least 20 minutes, preferably at least 30 minutes.

During the irradiation step, the mixture is irradiated by a light radiation, the spectra of which presenting typically a maximum absorption wavelength in the range of 160 nm to 800 nm, and typically 200 nm to 500 nm. Preferably, the light radiation is absorbed by the chromophore presenting the mixture.

Preferably, the spectra of the light radiation covers at least in part the absorption spectra of the chromophore presenting the mixture. The light radiation spectra is preferably in the UV domain.

In one embodiment, the light radiation spectra is within the UV domain, i.e. from 280 nm to 400 nm.

The light radiation is preferably emitted by an artificial light source, non natural, emitting within visible and/or ultraviolet wavelength, such as for example a discharge lamp (high, medium or low pressure), and incandescent lamp, a laser or a LED; One may use for example Hamamatsu lightningcure LC5, optionally equipped with an elliptic reflector.

The time period of irradiation is function of light source, power, amount and nature of photo-initiator, if present, and of metallic precursor.

The time-period of the irradiation step is for example of 1 to 120 minutes, preferably of 5 to 60 minutes, advantageously of 10 to 40 minutes.

It is preferable that light radiations power by surface unit (fluence) be higher than 50 mW/cm$^2$, advantageously higher than 80 mW/cm$^2$, for example of about 200 mW/cm$^2$.

The irradiation is typically performed at room temperature, i.e. from 15° to 30° C., preferably from 20° to 25° C.

Advantageously, the present invention enables the preparation of a metallic mirror by way of a method involving a step of irradiation of the composite during the preparation thereof. This specific method comprises the coupling of photo-polymerization of a polymer matrix together with the photo-reduction of metallic particles.

In one embodiment, the step b) of forming particles 5 of said conducting metal, is performed by photo-reduction.

Advantageously, such photo-reduction is performed at the same time as the photopolymerization of the monomer.

Preferably, the method comprises a one-step including polymerizing the polymer matrix 50, 150 and forming the metallic particles 5, 105.

The present invention also relates to a method for in situ preparation of electronically conducting particles, said method comprising implementing the method for preparing the composite material according to the invention to prepare in situ particles 5 in a matrix 50 comprising at least one polymer 55.

In one embodiment, said method comprises a variation of the irradiation of the UV source to induce the photo-reduction of the electronically conducting metal precursor according to a specific design.

According to one embodiment, the specific design is achieved by photolithography, for example contact lithography. In one embodiment a photomask is used.

For example, the UV irradiation of the liquid composition makes use of an amplitude mask. Such amplitude mask may comprise photoresist (light-sensitive material) which has a plurality of UV-transmissive and UV-opaque features indicative of the desired pattern for forming said specific design.

According to one embodiment, a thin film of UV-sensitive photoresist material is placed between the liquid composition of the invention and a UV source. Such film comprises areas protected by a UV-opaque material designed to make the desired specific design. In general, in contact lithography, the mask is in contact with the liquid composition or the substrate to be irradiated. Photoresist material is coated onto the liquid composition or substrate, a photomask is placed on the photoresistive material layer, exposed to UV radiations, then removed, the photoresistive material exposed to UV is removed enabling recovering the composite material, optionally with the substrate, with the desired specific design.

According to one embodiment, the specific design is achieved by inkjet printing.

In one embodiment, said design forms wires at one or more surfaces of the composite material, or a microelectronic conductor.

The invention also relates to a substrate according to a substrate 100 comprising at least one composite material 101 as defined according to the present invention.

Said substrate 100 is for example selected from the group consisting of silica; textile; metallic substrates, such as for example inox, aluminum, alloy; wood; terephthalate, such as for example polyfluoroalkylene (tetrafluoroethylene—Teflon®), plastic materials, and any mixture thereof. Silica includes derivative thereof such as glass (silicate glasses).

In one embodiment, said substrate 100 is a textile.

The invention also relates to a substrate 100 according to the present invention, wherein said substrate 100 is a textile and wherein said composite material 101 is embedded in an area 102 of the textile substrate 100.

In one specific embodiment, said textile substrate 100 forms an intelligent textile 200 comprising one or more captors 203 intended to interact with the body 207 of the person wearing the textile 200 and an electronic device 204, and wherein said one or more captors 204 are electronically connected to at least one area 202 of said composite material 101.

In one aspect of the invention, said composite material is used for forming a metallic mirror layer on a substrate 60, 100. In one embodiment, said layer covers partially at least one surface of the substrate 60, 100. In another embodiment, said layer covers totally at least one surface of the substrate 60, 100.

The invention also relates to a method according to a method for conducting heat or electricity wherein said method comprises contacting an electronically conducting surface (8 of at least one composite material 1 as defined in claim 1 with heat or electricity and conducting heat or electricity, respectively, though said electronically conducting surface (8 of said composite material 1).

According to one aspect, the composite material of the present invention is used in conducting devices or more generally, for conduction. In such applications, the composite material is typically used as one or more coating layers or ink. These applications include for example, but are not limited to: conducting circuits; computer keyboard; heating elements; sensors including automotive sensors, biosensors; touchscreen; electroluminescent devices; intelligent clothing, intelligent textiles or electronic textiles.

According to one aspect, the composite material of the present invention is for optic applications. These applications include for example, but are not limited to: optics, in particular military optic, telescopes, flight electronic devices, analytical instruments, lasers.

According to one aspect, the composite material of the present invention is for decoration, in particular for obtaining a mirror effect. Such applications include for example, but are not limited to: object covering, inks in particular for textiles, etc.

According to one aspect, the composite material of the present invention is for anti-microbial applications. Such applications include for example, but are not limited to: covering of medical devices.

Other aims, characteristics, and advantages of the invention will appear clearly to the skilled person in the art upon reading the explanatory description which makes reference to the examples which are given simply as an illustration and which in no way limit the scope of the invention.

The examples make up an integral part of the present invention and any characteristic which appears novel with respect to any prior state of the art from the description taken its entirety, including examples, makes up an integral part of the invention in its function and in its generality.

Thus, every example has a general scope.

In the examples, all percentages are given by weight, unless indicated otherwise, temperature is expressed in degree Celsius unless indicated otherwise. Also pressure and temperatures are atmospheric pressure and room temperature (around 20° C. and 101 325 Pa), unless indicated otherwise.

EXAMPLES

Example 1: Preparation of a Composite Material 0.5% chromophore Irgacure 819 marketed by BASF are added to 2 grams of acrylic monomer (SR610/PEG 600DA, hereinafter "Monomer 1"). The mixture is briefly agitated for homogenization. To the mixture, 5% by weight of $AgNO_3$ are added, which are previously dissolved in three drops of $H_2O$ (80 µL $H_2O$). The mixing is maintained until complete dissolution of the photo-intiator and $AgNO_3$. The whole is kept off from light radiation.

One drop of this formulation is disposed on a glass substrate and then is spread in order to obtain a uniform coating. The substrate is then coated by the solution and then irradiated under UV lamp during twenty minutes at a power of 200 mW/cm$^2$.

A metallic layer forming a metal mirror without cracks is obtained on the surface of the substrate. One may also see that this metallic layer is bounded to a plastic matrix attached to the glass substrate.

Moreover, if the metallic layer is taken off it is possible to repeat the procedure to prepare a new metal layer (10 min irradiation for example).

It is possible to prepare a metallic layer on the opposite side of the matrix. The matrix already formed presents a metallic layer on its surface in contact with atmosphere. The other side is in contact with the glass substrate. By irradiating the matrix through the glass surface (on the side opposite to the side of the matrix in contact with air) it was possible to form a new metallic layer at the surface of the matrix in contact with the glass substrate, which layer also forms a metallic mirror layer.

Example 2—Kinetics of the Synthesis Reaction of Ag Nanoparticles in a Polymer Matrix A formulation (S1), containing 5% metal precursor (AgNO$_3$), 0.5% of chromophore (Irgacure 2959-[4-(2-hydroxyethoxy)-phenyl]-2-hydroxy-2-methyl-1-propane-1-one)) and 2 grams of monomer (SR610 (Polyethylene Glycol (600) Diacrylate, or PEG 600 DA)), was deposited on a glass sheet and spread using a 100 µm-calibrated bar. The film was then exposed to a UV lamp. Characterisation by UV-Vis spectroscopy was performed to visualise the synthesis of the metal nanoparticles in the polymer matrix.

In view of the UV-visible spectra obtained throughout UV exposure, the formation of the first nanoparticles starts 5 seconds after exposure to light with the onset of the plasmon band at 420 nm. The plasmon band increases with the increase in exposure time, which corresponds to an increase in the concentration of synthesised nanoparticles. After an irradiation time of 20 minutes, a highly reflective layer (mirror) is observed above the nanocomposite film (the part exposed to air). It is to be noted that underneath the film (glass sheet side) there is no reflective layer.

Example 3—Characterisation by Scanning Electron Microscopy (SEM) of the Ag/Polymer Composite Previously Obtained The sample (S1) was previously vacuum metallised by cathode sputtering a layer of gold having a thickness of about ten nanometres.

The composite material obtained presents a metallic mirror surface which is observed by naked eyes. Observations under scanning electron microscope showed good distribution of silver particles on the surface obtained by photo-reducing the metal precursor in the polymer matrix. The cross-sectional image of the material showed that the thickness of the composite film is of about 5 µm. For more detailed information on the chemical nature of the nanocomposite film obtained, chemical analysis by energy dispersive X-ray analysis (EDX) was conducted.

Example 4—Energy Dispersive X-Ray Analysis

Energy dispersive X-ray analysis confirmed the presence of silver, gold, carbon and oxygen. The carbon and oxygen originate chiefly from the polymer matrix. The gold signal originates from the metal layer deposited on the surface of the sample during metallisation and the silicon signal originates from the glass sheet on which the sample was previously deposited.

Example 5—Characterisation by Transmission Electron Microscopy (TEM) of the Nanocomposite The sample S1 was then characterised by TEM and after microtome cutting of the sample.

The TEM images showed spherical nanoparticles, well dispersed in the matrix and most homogeneous in size with a mean diameter of about 10 nm. The TEM images showed the same type of particles located at the surface of the matrix, and forming a metallic layer of particles in close contact each other. The particles found in the surface layer are much more concentrated than in the matrix. The surface layer is continuous according to a macroscopic observation. The increase in concentration of Ag nanoparticles at the surface of the matrix is consistent with the formation of an Ag mirror film. The mirror film presents a thickness of 100 to 200 nm.

Example 6—X-Ray Photoelectron Spectroscopy (XPS) Analysis of the Nanocomposite Film Obtained XPS spectra recorded on a silver mirror/polymer (sample S1) were obtained after 10-minute irradiation at 200 mW/cm$^2$ and after 1 month in air.

TABLE 1

Ag 3d XPS fitting parameters and relative atomic concentrations.

| Block Id | Name | Position | Area/(RSF * T * MF) | % At conc |
|---|---|---|---|---|
| Ag 3d | Ag 3d5/2 met | 368.18 | 14.3474 | 59.84 |
| Ag 3d | Ag 3d5/2 Ag2O | 368.30 | 9.62988 | 40.16 |

The spectra on the surface of the sample after 1 month exposed to air confirmed the results obtained with EDX and hence the presence of the elements Ag, C, O. The Ag 3d spectrum showed the presence of Ag(0), but also oxidation of the nanoparticles through the presence of the oxide Ag$_2$O. Table 1 gives the position of the peaks and the atomic concentrations of the metal silver and oxidized silver.

The sample was then scratched with a scalpel blade to determine the chemical composition of the sample at depth in the nanocomposite film. The presence of the three elements (Ag, C, O) was confirmed and the Ag 3d spectrum only showed the peak corresponding to Ag(0) which means that in the polymer matrix the nanoparticles are not oxidized after an exposure time in open air of 1 month. The C and O derive from the polymer matrix.

The influence of different parameters (light intensity, irradiation time, film thickness, concentration of metal salt, chromophore type and concentration, type of substrate and type of monomer) on the synthesis of nanoparticles and mirror formation was examined.

Example 7—Study on the Influence of Light Intensity

Two light intensities of 50% and 100% were tested. Table 2 summarises the compositions of the S1 photosensible formulation of the corresponding mirror films.

TABLE 2

Composition of the S1 formulation of the corresponding films.

| Formulation | Intensity | Time | Type of film thickness | Thickness |
|---|---|---|---|---|
| S1 | 50% | 10 min | Medium | 243 µm |
| Monomer 1 AgNO$_3$ (5%) Ch1 (0.5%) | 100% | 10 min | Medium | 120 µm |

At high intensity (200 mW/cm$^2$ at 100% lamp intensity) and an irradiation time of 10 minutes, a highly reflective film with good resistance to the «scratch test« was obtained. The mirror film obtained with lower light intensity (80 mW/cm$^2$ at 50% lamp intensity) displayed a darker appearance and was less reflective with a fragile mirror film. The UV exposure time of 10 minutes was insufficient to obtain complete polymerization of the monomer (soft film), the less reflective mirror effect being due to a smaller number of silver nanoparticles formed on the surface.

Example 8—Study on the Influence of Irradiation Time

To examine the influence of irradiation time on nanocomposite synthesis, the S1 formulation was irradiated with 50% lamp intensity for different exposure times. Table 3 summarises the composition of the S1 formulation and irradiation conditions of the corresponding nanocomposite films.

TABLE 3

Compositions of the S1 formulation and exposure conditions of the films obtained.

| Formulation | Intensity | Time | Type of film thickness | Thickness |
|---|---|---|---|---|
| S1 | 50% | 10 min | Medium | 243 μm |
| Monomer 1 | 50% | 20 min | Medium | 227 μm |
| AgNO$_3$ (5%) | 50% | 30 min | Medium | 180 μm |
| Ch1 (0.5%) | | | | |

The aspect of the composite showed a more silvery and more reflective film when the exposure time is increased from 10 min to 30 min. A reduction in the thickness of the nanocomposite films due to increasingly stronger cross-linking of the monomer and contraction of film volume were observed as a function of UV exposure time. At the same time the mirror film became increasingly more resistant to the « scratch test ».

Example 9—Study on the Influence of Thickness

The purpose was to examine the influence of film thickness on the physical and optical properties of a nanocomposite film. For this purpose, different films thicknesses were prepared from different quantity of formulation S1 applied (using different bar coaters) a on a glass sheet (thin, medium and thick) and then irradiated with 50% lamp intensity for 20 minutes.

Table 4 summarises the tested formulation (S1) and the irradiation conditions.

TABLE 4

Compositions of the S1 formulation of different films.

| Formulation | Intensity | Time | Type of film thickness | Thickness |
|---|---|---|---|---|
| S1 | 50% | 20 min | Thin | 92 μm |
| Monomer 1 | 50% | 20 min | Medium | 150 μm |
| AgNO$_3$ (5%) | 50% | 20 min | Thick | 409 μm |
| Ch1 (0.5%) | | | | |

It is interesting to note that, in the light of the results obtained, the quality of the three films is closely similar. Irrespective of the thickness of the film, the reflective layer is always obtained.

Example 10—Study on the Influence of Silver Nitrate Concentration

The objective of this study was to examine the influence of the concentration of silver nitrate on the characteristics of the nanocomposite films obtained via photochemical process, but also to evaluate the minimum concentration of metal precursor to obtain the mirror effect. Several syntheses were performed with different concentrations of AgNO$_3$.

The three formulations contained monomer 1, 0.5% Iragacure 2959 ("Ch1" in the present invention) with different concentrations of AgNO$_3$ (8%, 5%, 2% and 1%). Table 5 summarises the composition of the different formulations and irradiation conditions for each synthesis.

TABLE 5

Compositions of different formulations (S1, S16, S17) of the films obtained.

| Formulation | Intensity | Time | Type of film thickness |
|---|---|---|---|
| S AgNO$_3$ (8%) | 50% | 40 min | Medium |
| S1 AgNO$_3$ (5%) | 50% | 40 min | Medium |
| S16 AgNO$_3$ (2%) | 50% | 40 min | Medium |
| S17 AgNO$_3$ (1%) | 50% | 40 min →60 min | Medium |

It can be seen that with a low percentage of silver nitrate (1%) the sample does not exhibit the reflective layer of silver nanoparticles as observed with the 8%, 5% and 2% precursors. Nonetheless, the film obtained (S17) displays a dark brown colour corresponding to a high concentration of Ag nanoparticles but insufficient to form the reflective metallic film as obtained for samples S1 and S16. It can therefore be concluded that the concentration of silver precursor plays a major role in mirror formation, and the minimum concentration of precursor to obtain this mirror effect under these conditions is 2%.

Example 11—Study on the Influence of Type of Chromophore

To examine the influence of the type of photoinitiator, a constant concentration of chromophore (0.5%) and silver nitrate (5%) for an exposure time of 40 minutes was used. Table 6 summarises the composition of the formulations and irradiation conditions for each synthesis.

TABLE 6

Compositions of different formulations (S1, S18, S20) of the films obtained.

| Formulation | Intensity | Time | Type of film thickness |
|---|---|---|---|
| S1 Ch1 (0.5%) Monomer 1 AgNO$_3$ (5%) | 50% | 40 min | Medium |
| S18 Ch2 (0.5%) Monomer 1 AgNO$_3$ (5%) | 50% | 40 min | Medium |
| S20 Ch3 (0.5%) Monomer 1 AgNO$_3$ (5%) | 50% | 40 min | Medium |

Mirror films were obtained with the three chromophores, allowing the conclusion to be drawn that the type of photoinitiator does not have any influence on the formation of the reflective layer under these conditions.

Example 12—Study on the Influence of Type of Monomer

Several monomers were examined

| Macromonomer | Chemical Name |
|---|---|
| SR 610, n = 14 | Polyethylene glycol (600) diacrylate |
| SR 344, n = 9 | Polyethylene glycol (400) diacrylate |
| SR 252, n = 14 | Polyethylene glycol (600) dimethacrylate |
| SR 206 | Ethylene Glycol Dimethacrylate |

Mirror films were obtained with monomers having acrylate end units, in particular with diacrylate or dimethacrylate structures. Best results were obtained with polyalkylglycol diacrylates and polyalkylglycol dimethacrylate.

Example 13—Study on the Influence of the Substrate

S1 formulation was deposited on different substrates and irradiated with 100% lamp intensity (200 mW/cm$^2$) for 10 minutes. Table 8 gives the different tested substrates, irradiation conditions and the corresponding images for each synthesis.

TABLE 7

Compositions of the S1 formulation S1 for different substrates

| Formulation | Substrate | Intensity | Time | Type of film thickness |
|---|---|---|---|---|
| S1 | glass | 100% | 10 min | Medium |
| Monomer 1 | Stainless steel | 100% | 10 min | Medium |
| AgNO$_3$ (5%) | Wood | 100% | 10 min | Medium |
| Ch1 (0.5%) | Brass | 100% | 10 min | Medium |
|  | aluminum | 100% | 10 min | Medium |
|  | Teflon | 100% | 10 min | Medium |
|  | Plastic | 100% | 10 min | Medium |

Qualitative analysis of the results obtained clearly showed that the silver/polymer nanocomposite with a mirror layer on different substrates is obtained under the tested conditions: glass, stainless steel, wood, brass, aluminium, Teflon, plastic, paper and textile.

To conclude, the type of substrate does not have any influence on the formation of the nanocomposite and of the reflective layer.

Example 14—Direct Writing with the Nanomaterial Obtained

Formulation S1 was tested for use as ink to write directly on a glass substrate. It was possible to conclude that it is possible to write inscriptions with the formulation on the substrate using a Pasteur pipette. Then the sample was irradiated 20 minutes with 50% lamp intensity for example. The results obtained showed the developed formulation can clearly be used as ink under the experimental conditions for preparing a polymer matrix with nanoparticles according to the invention.

Example 15—Study on Conductivity

Silver is a very good electrical and thermal conductor (electrical conductivity=63×106 S·m$^{-1}$ and thermal conductivity=429 W·m$^{-1}$·K$^{-1}$).

Conductivity was evaluated using apparatus known as an «Ohmmeter»; this instrument measures electrical resistance i.e. the capability of the material to prevent electric current from circulating. The two electrodes of the instrument were placed directly on the nanoparticle film.

$R = l/\gamma * s$

R: resistance (ohms)
l: length (m)
γ: conductivity (siemens·m$^{-1}$)
S: surface area (m$^2$)

Example 16—Influence of Irradiation Time on Conductivity

Electrical resistance was measured after an irradiation time of 20 and 40 minutes on a sample prepared with the S1 formulation (Table 9)

TABLE 8

Compositions of the S1 formulation for different exposure times.

| Formulation | Intensity | Time | Type of film thickness | Apparent resistance |
|---|---|---|---|---|
| S1 | 50% | 20 min | Medium | 3 MΩ |
| Monomer 1 | 50% | 40 min | Medium | 8 Ω |
| AgNO₃ (5%) | | | | |
| Ch1 (0.5%) | | | | |

Resistance decreases with an increase in UV exposure time. This could be accounted for by the increased concentration of formed silver nanoparticles and coalescence of the nanoparticles on the mirror layer.

The silver/polymer sample was about 1 cm in length, 1 cm in width and 200 µm thick. An apparent resistance of 8Ω was measured, therefore the apparent resistivity is:

$$\rho = R \cdot l \cdot e / L$$

ρ: apparent resistivity
L: length
l: width
e: thickness
Hence: $\rho = 8 \times 10^{-2} \times 200 \times 10^{-6} / 10^{-2} = 1600 \times 10^{-6}$ Ω·m $\rho = 1.6 \times 10^{-3}$ Ω·m However the value of solid Ag is $1.5 \times 10^{-8}$ Ω·m. Nevertheless, the measurements were taken using a simplistic technical setup (ohmmeter) and therefore the electric contact between the electrodes and the sample was not perfect (possible damage to film), and on this account one shall use the term «apparent» resistance or resistivity. In addition, for the calculation the thickness of the sample was considered to be 200 µm which is effectively the thickness of the Ag/polymer sample but not the thickness of the mirror film itself which is probably 100 to 200 nm, hence an underestimation of the electric resistivity.

Example 17—Influence of AgNO₃ Concentration

The influence of the concentration of metal precursor on the resistance of the film obtained was examined. The electrical resistances of three films obtained with variable concentrations of AgNO₃ (5%, 2% and 1%) are given in Table 10.

TABLE 9

Compositions of different formulations (S1, S16, S17) for decreasing AgNO₃ concentrations

| Formulation | Intensity | Time | Type of film thickness | Apparent resistance |
|---|---|---|---|---|
| S1 | 50% | 40 min | Medium | 8 Ω |
| AgNO₃ (5%) | | | | |
| S16 | 50% | 40 min | Medium | 160 Ω |
| AgNO₃ (2%) | | | | |
| S17 | 50% | 40 min | Medium | x |
| AgNO₃ (1%) | | →60 min | | |

The electrical resistance of the nanoparticle films increases with a decrease in concentration of metal precursor: it is 8Ω for 5%, 160Ω for 2% and no conduction for 1% AgNO₃.

Example 18—Influence of Light Intensity on Conductivity

Two light intensities were used: 50% and 100% of the nominal power of the light. Table 11 gives the S1 formulation and the conditions used together with the values of the electrical resistances obtained after an irradiation time of 20 minutes.

TABLE 10

Compositions of the S1 formulation for different light intensities

| Formulation | Intensity | Time | Type of film thickness |
|---|---|---|---|
| S1 | 50% | 20 min | Medium |
| Monomer 1 | 100% | 20 min | Medium |
| AgNO₃ (5%) | | | |
| Ch1 (0.5%) | | | |

Electrical resistance increases with an increase in light intensity. Under synthesis conditions such as those illustrated in Table 11, the strong light intensity allowed very fast polymerization of the matrix thus thwarting nanoparticle formation and growth, whereas with 50% lamp power the intensity was lower allowing longer polymerization kinetics and hence a greater number of developed nanoparticles.

The photo-induced synthesis of an Ag/polymer nanocomposite was performed. This nanocomposites were characterised by different methods such as SEM, TEM, UV-Vis and XPS.

Characterization by UV-Vis spectroscopy showed the presence of a plasmon band with a maximum at 420 nm, a band characteristic of Ag(0) nanoparticles of very small size. TEM characterisation showed nanoparticles of about ten nanometres in size in the volume of the sample, on the other hand SEM showed the formation of larger particles on the surface of the sample which are aggregates (about 200-500 nm) of smaller particles.

Of great interest, under particular synthesis conditions, the photo-induced approach allowed a reflective layer (mirror) to be obtained on the surface of the nanocomposites irrespective of the type of substrate used (glass, wood, stainless steel, etc.). In addition this layer is uniform and conductive.

A minimum concentration of 2% AgNO₃ was needed for the formation of the mirror layer under the experimental conditions.

Under the experimental conditions, monomers of diacrylic type, such as Monomer 1, allow films with excellent homogeneity and high metallic reflectivity to be obtained.

Example 19—Preparation of a Composite Material Comprising Au

The same protocol was used as in example 1: Gold precursors (AuBr₃, at 1% or 2%, by weight of the total weight of the liquid composition) were used instead of silver precursors (AgNO₃).

A metallic layer forming a gold metal mirror without cracks is obtained on the surface of the substrate. One may also see that this metallic layer is bounded to a plastic matrix attached to the glass substrate.

Example 20—Preparation of a Composite Material Comprising Cu

The same protocol was used as in example 1: Copper precursors ((Cu(CH₃COO)₂), at 0.5%, 1%, 2%, and 5% by weight of the total weight of the initiating composition) were used instead of silver precursors (AgNO₃).

A metallic layer forming a gold metal mirror without cracks is obtained on the surface of the substrate. One may also see that this metallic layer is bounded to a plastic matrix attached to the glass substrate.

To avoid oxidation of the Cu(0) nanoparticles a stabilizer (an amine for example N-methyle diethanolamine MDEA (25 μl to 75 μl) is added to the preparation of Cu composite materials. Without stabilizer a composite polymer $Cu_2O$ is obtained.

Example 21—Preparation of a Composite Material Comprising Pd

The same protocol was used as in example 1: Palladium precursors ($PdCl_2$, at 2% or 5%, by weight of the total weight of the liquid composition) were used instead of silver precursors ($AgNO_3$). The dissolution of the metallic precursor needs the addition of small quantities of HCl, for example 50 μL) and 50 μL $H_2O$.

A metallic layer forming a palladium metal mirror without cracks is obtained on the surface of the substrate. One may also see that this metallic layer is bounded to a plastic matrix attached to the glass substrate.

Example 22—Preparation of a Composite Material Comprising Sn

The same protocol was used as in example 1: Tin precursors ($SnCl_4$ 2 or 5%, by weight of the total weight of the liquid composition) were used instead of silver precursors ($AgNO_3$). Also, the tin precursors were dissolved directly in the monomer.

A metallic layer forming a tin metal mirror without cracks is obtained on the surface of the substrate. One may also see that this metallic layer is bounded to a plastic matrix attached to the glass substrate.

Example 23—Preparation of a Composite Material Comprising Zn

The same protocol was used as in example 1: Zinc precursors ($Zn(NO_3)_2$ 2 or 5%, by weight of the total weight of the liquid composition) were used instead of silver precursors ($AgNO_3$).

A metallic layer forming a zinc metal mirror without cracks is obtained on the surface of the substrate. One may also see that this metallic layer is bounded to a plastic matrix attached to the glass substrate.

Example 24—Preparation of a Composite Material by Inkjet

The formulation used in example 1 was diluted with 50% (v/v) water (1 volume of formulation according to example 1 and 1 volume of water). The dynamic viscosity of the diluted composition is decreased to 10 cP at 40° C. thereby enabling its printing via a conventional inkjet printer. The conventional inkjet printer is worked to print on a glass sample the composition.

The design of sample obtained by inkjet printing is in accordance with the design uploaded in the inkjet software program. The printed composition comprises a metallic layer forming a silver metal mirror without cracks on the surface of the substrate. One may also see that this metallic layer is bounded to a plastic matrix attached to the glass substrate.

Example 25—Reflectance

The reflectance of the composite material prepared according to example 1 has been tested and compared with optically polished massive metallic silver. This test has been performed with a UV-visible spectrophotometer with an integration sphere.

The spectral reflectance curve of the composite material surface is very close to the spectral reflectance curve of optically polished massive metallic silver.

Example 26—Thermal Treatment

The composite materials prepared according to example 1 have undergone different thermal treatment to evaluate the influence of such treatment on the reflectance of their metallic mirror surface.

Treatment at 100° C. During 5 Minutes:
The surface provides a blue or coppery color depending on the incident light on the surface of the composite material.
Treatment at 200° C. During 5 Minutes:
The surface provides a pearly aspect.
Treatment at 300° C. During 5 Minutes:
The surface provides a gold aspect.
Treatment at 450° C. During 5 Minutes:
The surface provides a raw silver aspect.

The invention claimed is:

1. A method for preparing a composite material comprising a matrix and a continuous metallic mirror surface layer located at at least one surface of said composite material, said matrix comprising at least one polymer and a first population of discrete particles of at least one electronically conducting metal, said layer comprising a second discrete population of particles of at least one electronically conducting metal, the concentration of the discrete particles of said second population in said layer being greater than the concentration of the discrete particles of the first population in said matrix, said method comprising:
preparing a liquid composition comprising at least one precursor of at least one electronically conducting metal, at least one photopolymerizable monomer, and optionally at least one photoinitiator;
exposing the liquid composition obtained in the preparing step to UV radiations in the presence of a UV source providing a light intensity sufficient to photopolymerize said monomer to form a polymer matrix and sufficient to induce the photoreduction of said electronically conducting metal precursor to form particles forming a continuous metallic mirror surface layer located at said at least one surface of said composite material; and
wherein said particles form at least two populations of discrete particles,
wherein a first population of discrete particles is dispersed in the polymer matrix, and
wherein a second population of discrete particles forms said continuous metallic mirror surface layer.

2. The method according to claim 1, further comprising depositing said liquid composition on a substrate.

3. The method according to claim 1, wherein said UV source provides an intensity of at least 1 $W/cm^2$ on the liquid composition.

4. The method according to claim 1, wherein said photopolymerization is performed in the presence of a UV source providing an intensity of at least 0.5 $W/cm^2$ on the liquid composition.

5. The method according to claim 1, wherein said photopolymerization is performed during a time sufficient to induce the photopolymerization and the photoreduction of the electronically conducting metal precursor to form discrete particles of electronically conducting metal, wherein the discrete particles form at least two populations of discrete particles as defined in claim 1.

6. The method according to claim 1, wherein said electronically conducting metal is selected from Ag, Au, Cu, Pd, Pt, Al, or any mixture thereof.

7. The method according to claim 1, wherein said layer forms an electronically conducting layer.

8. The method according to claim 1, wherein said liquid composition is exposed to the UV radiations at a fluence of at least 50 mW/cm$^2$.

9. The method according to claim 1, wherein the liquid composition comprises the at least one photo-initiator.

10. The method of claim 8, wherein the electronically conducting metal is dissolved in the liquid composition.

11. The method of claim 1, wherein the composite material comprises a transparent substrate.

12. The method of claim 1, wherein the composite material comprises a substrate, and wherein the substrate is glass, stainless steel, wood, brass, aluminium, Teflon, plastic, paper or textile.

13. The method of claim 1, wherein the exposing step is conducted for at least 20 minutes.

* * * * *